United States Patent
Hoeft et al.

(10) Patent No.: US 7,656,660 B2
(45) Date of Patent: Feb. 2, 2010

(54) AIRFLOW ARRESTING APPARATUS AND METHOD FOR FACILITATING COOLING OF AN ELECTRONICS RACK OF A DATA CENTER

(75) Inventors: Allan R. Hoeft, Poughkeepsie, NY (US); Madhusudan K. Iyengar, Woodstock, NY (US); Francis R. Krug, Jr., Highland, NY (US); Steven C. McIntosh, Kingston, NY (US); Matthew A. Nobile, Poughkeepsie, NY (US); Donald W. Porter, Highland, NY (US); Roger R. Schmidt, Poughkeepsie, NY (US); Howard P. Welz, Highland, NY (US)

(73) Assignee: International Business Machines Corporation, Armonk, NY (US)

( * ) Notice: Subject to any disclaimer, the term of this patent is extended or adjusted under 35 U.S.C. 154(b) by 240 days.

(21) Appl. No.: 11/942,818

(22) Filed: Nov. 20, 2007

(65) Prior Publication Data

US 2009/0129016 A1 May 21, 2009

(51) Int. Cl.
*H05K 7/20* (2006.01)

(52) U.S. Cl. .................. 361/679.51; 361/679.34; 361/679.46; 361/679.49; 361/695; 181/200; 181/224; 454/184

(58) Field of Classification Search ............... 361/690, 361/692, 695, 679.48, 679.34, 679.49, 679.51; 165/80.3; 181/198, 200, 201, 224; 454/184, 454/278; 174/16.1, 16.3
See application file for complete search history.

(56) References Cited

U.S. PATENT DOCUMENTS

| | | | | |
|---|---|---|---|---|
| 6,104,608 | A * | 8/2000 | Casinelli | 361/692 |
| 6,481,527 | B1 * | 11/2002 | French et al. | 181/201 |
| 7,334,662 | B1 * | 2/2008 | Anderl et al. | 181/200 |
| 7,549,917 | B2 * | 6/2009 | Henry et al. | 454/184 |
| 2003/0151894 | A1 | 8/2003 | Singer | |
| 2006/0185931 | A1 | 8/2006 | Kawar | |
| 2007/0064391 | A1 | 3/2007 | Lewis, II | |
| 2009/0129015 | A1 * | 5/2009 | Nobile | 361/692 |

OTHER PUBLICATIONS

"Inter-Rack Flow Seperator to Prevent Computer Rack Hot Exhaust Air Entry Into Cold Region at Rack Inlet of Computer Data Center Facilities", IBM, ip.com, Prior Art Database, ip.com No. IPCOM000137460D, pp. 1-4 (Jun. 20, 2006).

* cited by examiner

*Primary Examiner*—Jayprakash N Gandhi
*Assistant Examiner*—Courtney Smith
(74) *Attorney, Agent, or Firm*—Geraldine Monteleone, Esq.; Kevin P. Radigan, Esq.; Heslin Rothenberg Farley & Mesiti, P.C.

(57) ABSTRACT

An airflow arresting apparatus is provided configured to reside above an electronics rack within a data center. The apparatus includes an airflow arrester and a track mechanism. The airflow arrester includes a collapsible panel sized and configured to reside above the electronics rack, and when operatively positioned above the electronics rack, to extend vertically above the electronics rack and at least partially block airflow from passing over the electronics rack between the air outlet and air inlet sides of the rack. The track mechanism is sized and configured to reside above the electronics rack, and the airflow arrester is slidably engaged with the track mechanism. Positioning of the airflow arrester at a desired location above the electronics rack is facilitated by the airflow arrester slidably engaging the track mechanism.

20 Claims, 11 Drawing Sheets

AIRFLOW ARRESTING APPARATUS AND METHOD FOR FACILITATING COOLING OF AN ELECTRONICS RACK OF A DATA CENTER

TECHNICAL FIELD

The present invention relates in general to apparatuses and methods for facilitating cooling of rack-mounted assemblages of individual electronics units, such as rack-mounted computer server units, and more particularly, to apparatuses and methods for arresting airflow from a hot air aisle of a data center to a cold air aisle of the data center.

BACKGROUND OF THE INVENTION

The power dissipation of integrated circuit chips, and the modules containing the chips, continues to increase in order to achieve increases in processor performance. This trend poses a cooling challenge at both the module and system level. Increased airflow rates are needed to effectively cool high power modules and to limit the temperature of the air that is exhausted into the computer center.

In many large server applications, processors along with their associated electronics (e.g., memory, disk drives, power supplies, etc.) are packaged in removable drawer configurations stacked within a rack or frame. In other cases, the electronics may be in fixed locations within the rack or frame. Typically, the components are cooled by air moving in parallel airflow paths, usually front-to-back, impelled by one or more air moving devices (e.g., fans or blowers). In some cases it may be possible to handle increased power dissipation within a single drawer by providing greater airflow, through the use of a more powerful air moving device or by increasing the rotational speed (i.e., RPMs) of an existing air moving device. However, this approach is becoming problematic at the rack level in the context of a computer installation (i.e., a data center).

The sensible heat load carried by the air exiting the rack is stressing the ability of the room air-conditioning to effectively handle the load. This is especially true for large installations with "server farms" or large banks of electronics racks close together. In such installations not only will the room air-conditioning be challenged, but the situation may also result in recirculation problems with some fraction of the "hot" air exiting one rack unit being drawn into the air inlet of the same rack or a nearby rack. This recirculating flow is often extremely complex in nature, and can lead to significantly higher rack inlet temperatures than expected. This increase in cooling air temperature may result in components exceeding their allowable operating temperature and in a reduction in long term reliability of the components.

SUMMARY OF THE INVENTION

The shortcomings of the prior art are overcome and additional advantages are provided through the provision of an airflow arresting apparatus comprising an airflow arrester and a track mechanism. The airflow arrester includes a panel which is sized and configured to reside above an electronics rack, and when operatively positioned above the electronics rack, to extend vertically above the electronics rack and at least partially block airflow from passing over the electronics rack between an air outlet side and an air inlet side thereof. The airflow arrester slidably engages the track mechanism, which is also sized and configured to reside above the electronics rack. The track mechanism facilitates positioning of the airflow arrester at a desired location above the electronics rack between the air inlet side and the air outlet side thereof.

In another aspect, a data center is provided which includes at least one electronics rack and at least one airflow arresting apparatus. Each electronics rack includes: an air inlet side and an air outlet side, the air inlet and air outlet sides respectively enabling ingress and egress of external air; at least one electronics subsystem requiring cooling; and at least one air-moving device, the at least one air-moving device being capable of causing external air to flow from the air inlet side of the electronics rack, across the at least one electronics subsystem, to the air outlet side of the electronics rack. Each airflow arresting apparatus includes an airflow arrester and a track mechanism. The airflow arrester includes a panel which is sized and configured to reside above a respective electronics rack, and when operatively positioned above the electronics rack, to extend vertically above the electronics rack and at least partially block airflow from passing over the electronics rack between the air inlet side and the air outlet side thereof. The airflow arrester slidably engages with the track mechanism, which is also sized and configured to reside above the respective electronics rack. The track mechanism facilitates positioning of the airflow arrester at a desired location above the electronics rack between the air inlet side and the air outlet side thereof.

In a further aspect, a method of facilitating cooling of an electronics rack is provided. The method includes: providing an electronics rack comprising an air inlet side and an air outlet side, the air inlet and air outlet sides respectively enabling ingress and egress of external air; providing an airflow arresting apparatus comprising an airflow arrester, the airflow arrester comprising a panel sized and configured to reside above the electronics rack, wherein when operatively positioned above the electronics rack, the airflow arrester at least partially blocks airflow from passing over the electronics rack between the air outlet and air inlet sides thereof, thereby facilitating cooling of the electronics rack, and a track mechanism sized and configured to reside above the electronics rack, the airflow arrester slidably engaging the track mechanism; mounting the track mechanism above the electronics rack with the airflow arrester slidably engaged therewith; and securing the airflow arrester in a collapsed position above the electronics rack to facilitate shipment thereof.

Further, additional features and advantages are realized through the techniques of the present invention. Other embodiments and aspects of the invention are described in detail herein and are considered a part of the claimed invention.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

DETAILED DESCRIPTION OF THE INVENTION

As used herein, the terms "electronics rack", "rack-mounted electronic equipment", and "rack unit" are used interchangeably, and unless otherwise specified include any housing, frame, rack, compartment, blade server system, etc., having one or more heat generating components of a computer system or electronics system, and may be, for example, a stand alone computer processor having high, mid or low end processing capability. In one embodiment, an electronics rack may comprise multiple electronics subsystems or drawers, each having one or more heat generating components disposed therein requiring cooling. "Electronics subsystem" refers to any sub-housing, blade, book, drawer, node, compartment, etc., having one or more heat generating electronic components disposed therein. Each electronics subsystem of an electronics rack may be movable or fixed relative to the electronics rack, with the electronics drawers of a multi-drawer rack unit and blades of a blade center system being two examples of electronics subsystems of an electronics rack to be cooled. Further, "data center" refers to a computer installation containing one or more electronics racks to be cooled. As a specific example, a data center may include one or more rows of rack-mounted units, such as server units.

Reference is made below to the drawings, which are not drawn to scale for reasons of understanding, wherein the same reference numbers used throughout different figures designate the same or similar components.

Figure 1:
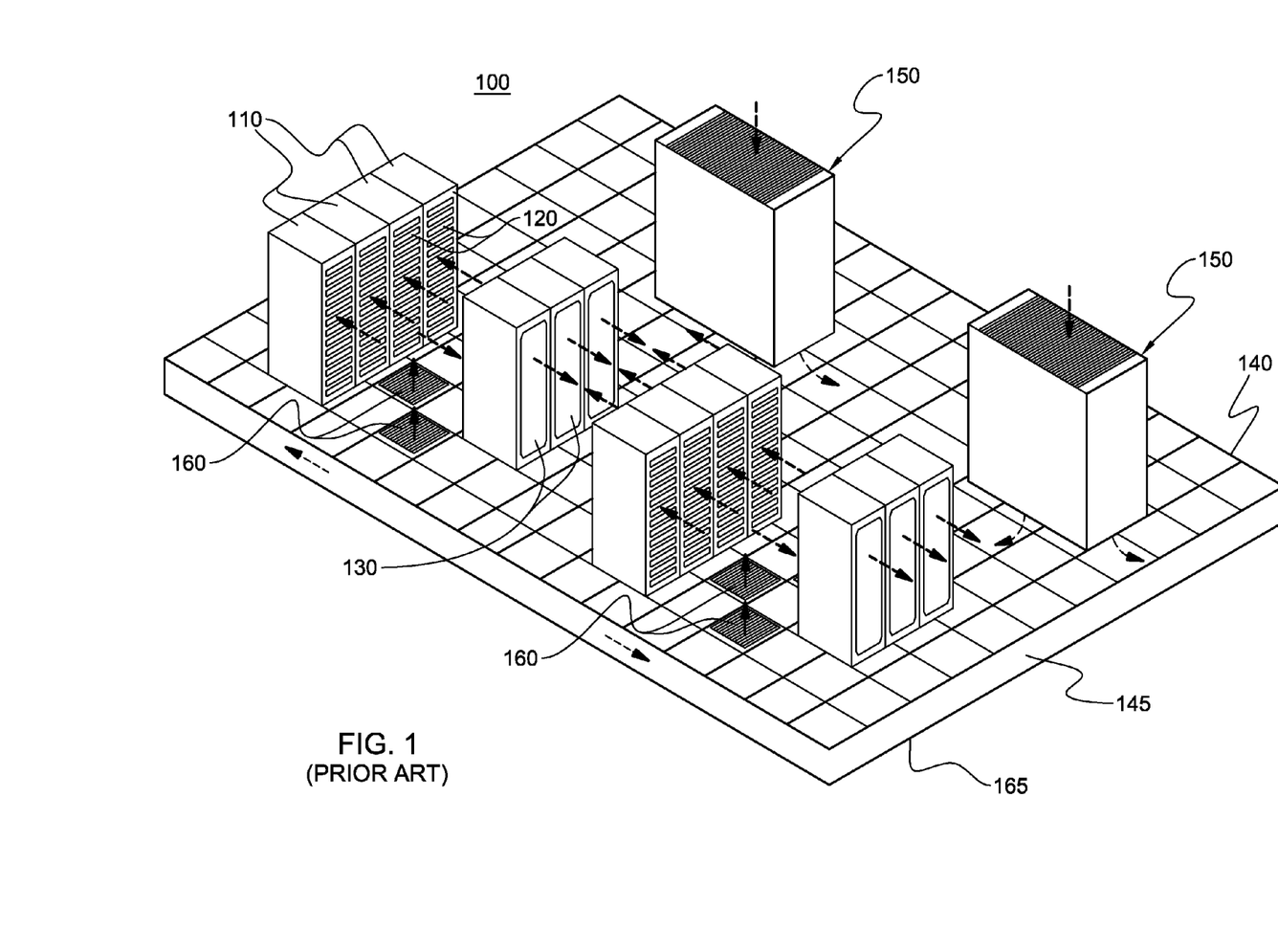
FIG. 1 depicts one embodiment of a conventional raised floor layout of an air-cooled data center.

FIG. 1 depicts a raised floor layout of an air cooled data center 100 typical in the prior art, wherein multiple electronics racks 110 are disposed in one or more rows. A data center such as depicted in FIG. 1 may house several hundred, or even several thousand microprocessors. In the arrangement illustrated, chilled air enters the computer room via perforated floor tiles 160 from a supply air plenum 145 defined between the raised floor 140 and a base or sub-floor 165 of the room. Cooled air is taken in through louvered covers at air inlet sides 120 of the electronics racks and expelled through the back (i.e., air outlet sides 130) of the electronics racks. Each electronics rack 110 may have one or more air moving devices (e.g., fans or blowers) to provide forced inlet-to-outlet airflow to cool the electronic components within the drawer(s) of the rack. The supply air plenum 145 provides conditioned and cooled air to the air-inlet sides of the electronics racks via perforated floor tiles 160 disposed in a "cold" aisle of the computer installation. The conditioned and cooled air is supplied to plenum 145 by one or more air conditioning units 150, also disposed within the data center 100. Also, as illustrated, the electronics racks 110 within a row of data center 100 are spaced apart. This is to ensure a greater supply of cooled air from perforated floor tiles 100 for each electronics rack.

Figure 2:
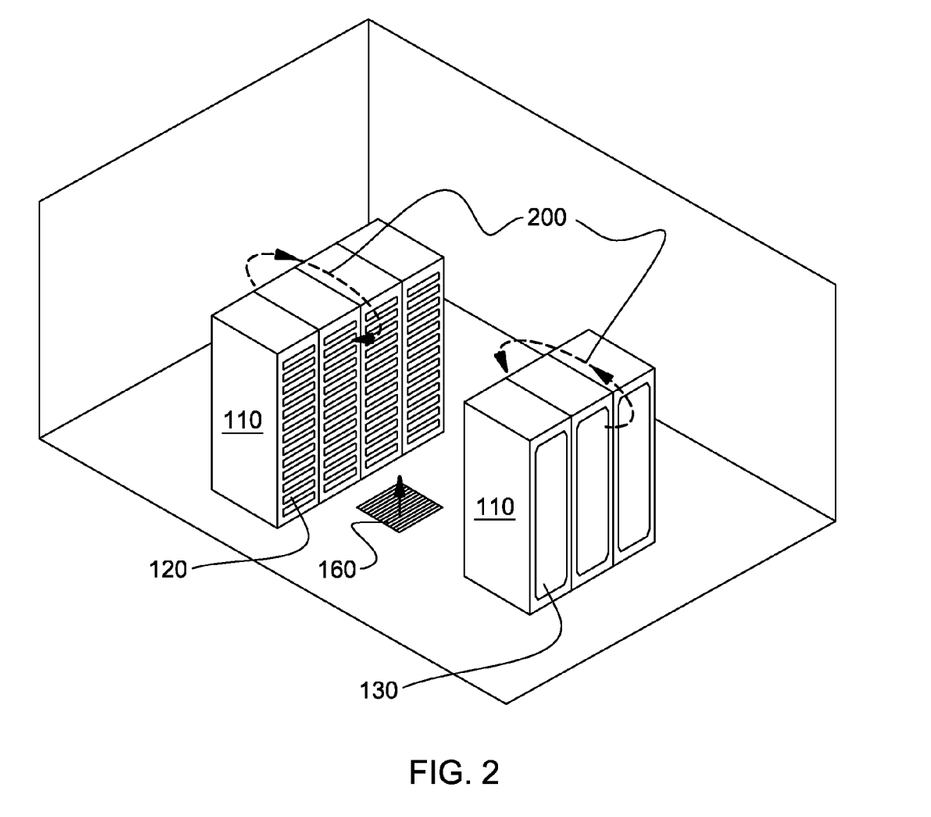
FIG. 2 depicts one problem addressed by the present invention, showing recirculation airflow patterns (in one implementation of a raised floor layout of an air-cooled data center) to be addressed by the apparatuses and methods disclosed herein, in accordance with an aspect of the present invention.

Due to the ever increasing airflow requirements through electronics racks, and limits of air distribution within the typical data center installation, recirculation problems within the room may occur. This is shown in FIG. 2 for a raised floor layout, wherein hot air recirculation 200 occurs from the air outlet sides 130 of the electronics racks 110 back to the cold air aisle defined by the opposing air inlet sides 120 of the electronics racks. This recirculation can occur because the conditioned air supplied through tiles 160 is only a fraction of the airflow rate forced through the electronics racks by the air moving devices disposed therein. This can be due, for example, to limitations on the tile sizes (or diffuser flow rates). The remaining fraction of the inlet side air supply is often made up by ambient room air through recirculation 200. This recirculating flow is often very complex in nature, and can lead to significantly higher rack unit inlet temperatures than desired.

The recirculation of hot exhaust air from the hot air aisle of the computer room installation to the cold air aisle can be detrimental to the performance and reliability of the computer system(s) or electronic system(s) within the racks. Data center equipment is typically designed to operate with rack air inlet temperatures in the 18-35° C. range. For a raised floor layout such as depicted in FIG. 2, however, temperatures can range from 15-20° C. at the lower portion of the rack, close to the cooled air input floor vents, to as much as 45-50° C. at the upper portion of the electronics rack, where the hot air can form a self-sustaining recirculation loop. Since the allowable rack heat load is limited by the rack inlet air temperature at the "hot" part, this temperature distribution correlates to an inefficient utilization of available chilled air. Also, computer installation equipment almost always represents a high capital investment to the customer. Thus, it is important from a product reliability and performance view point, and from a customer satisfaction and business perspective, to provide as uniform a temperature across the air inlet side of the rack unit as possible. The efficient cooling of such computer and electronic systems, and the amelioration of localized hot air inlet temperatures to one or more rack units due to recirculation of air currents, are addressed by the apparatuses and methods disclosed herein. Traditionally, higher air inlet temperatures to electronics racks have been addressed by increasing fan speeds within the rack units, however, this causes an increase in noise level within a data center. This is problematic since noise levels within the data center are already too high.

Figure 3:
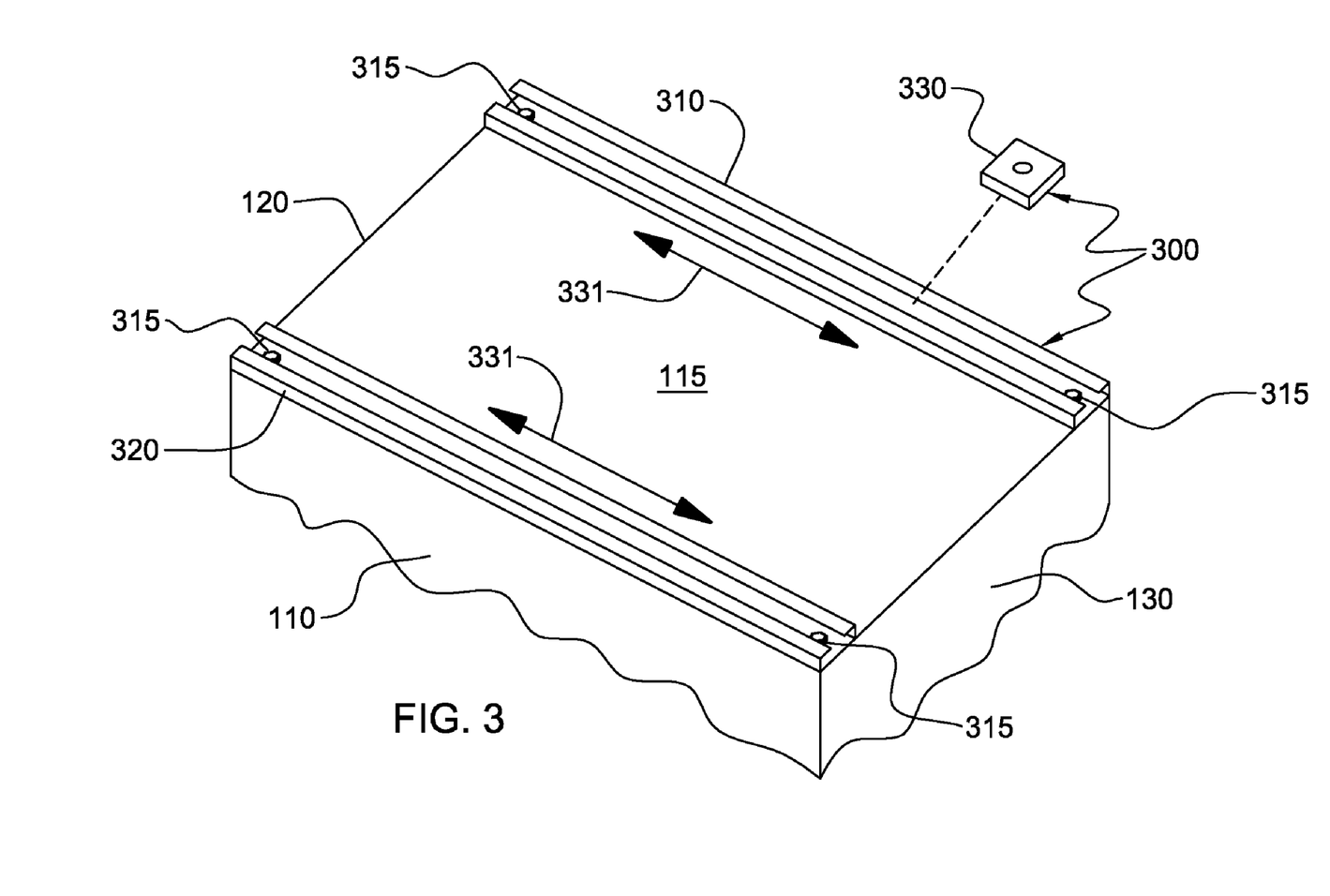
FIG. 3 is a partial isometric view of an electronics rack with a track mechanism of an airflow arresting apparatus disposed on a top surface thereof, in accordance with an aspect of the present invention.

FIG. 3 depicts an electronics rack 110 comprising a top surface 115, an air inlet side 120, and an air outlet side 130. Air inlet side 120 and air outlet side 130 respectively enable ingress and egress of external air through electronics rack 110 as described above. Mounted to top surface 115 of electronics rack 110 is one embodiment of a track mechanism, generally denoted 300, of an airflow arresting apparatus, in accordance with an aspect of the present invention. Track mechanism 300 comprises a first track 310 and a second track 320, each of which is sized and configured to reside above the electronics rack, and extend between the air outlet side and the air inlet side thereof, as illustrated. Each track 310, 320 is a C-shaped track cut to the length of electronics rack 110 and secured to top surface 115 via respective attachment mechanisms, such as bolts 315. Track mechanism 300 further includes multiple sliders 330, each sized and configured to slidably engage and reside within a respective track 310, 320. Depending on the implementation, slider 330 may comprise a positioning slider and/or a locking slider. As used herein, a "positioning slider" is a slider which is coupled to an airflow arrester of the airflow arresting apparatus for facilitating positioning of the airflow arrester along the top surface of the electronics rack, while a "locking slider" is a slider which facilitates locking of a positioning slider in a fixed position, for example, by use of a set screw which, when threaded, locks the locking slider against the respective track 310, 320. In addition, although described herein separately as positioning sliders and locking sliders, one skilled in the art will understand that the function of the locking slider could be readily incorporated into a positioning slider by, for example, extending the length of the positioning slider to allow for inclusion of a set screw within the positioning slider for threadably engaging the respective track, and thereby locking the positioning slider relative to the respective track. A "locking structure" refers herein to any locking mechanism employed to secure a positioning slider in fixed position relative to the respective track.

During assembly, the sliders are positioned within the respective tracks prior to securing the tracks to the top surface 115 of electronics rack 110 using bolts 315. Advantageously, each bolt 315 further functions as a stopper to retain the one or more sliders within the respective track. Arrows 331 illustrate the motion trajectory of sliders 330 when slidably engaging a respective track 310, 320.

Figure 4A:
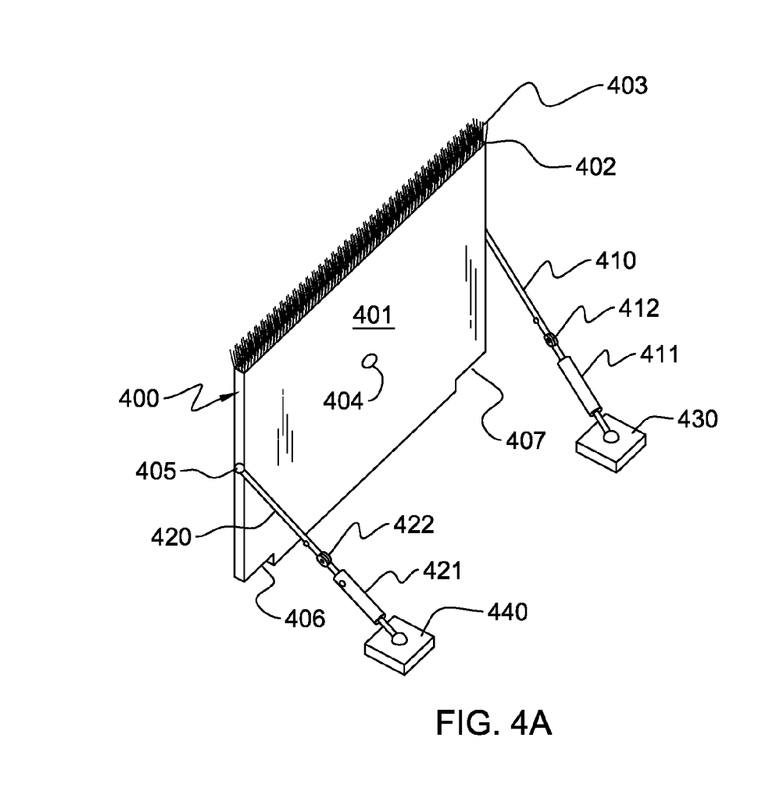
FIG. 4A is an isometric view of one partial embodiment of an airflow arresting apparatus, in accordance with an aspect of the present invention.
Figure 4B:
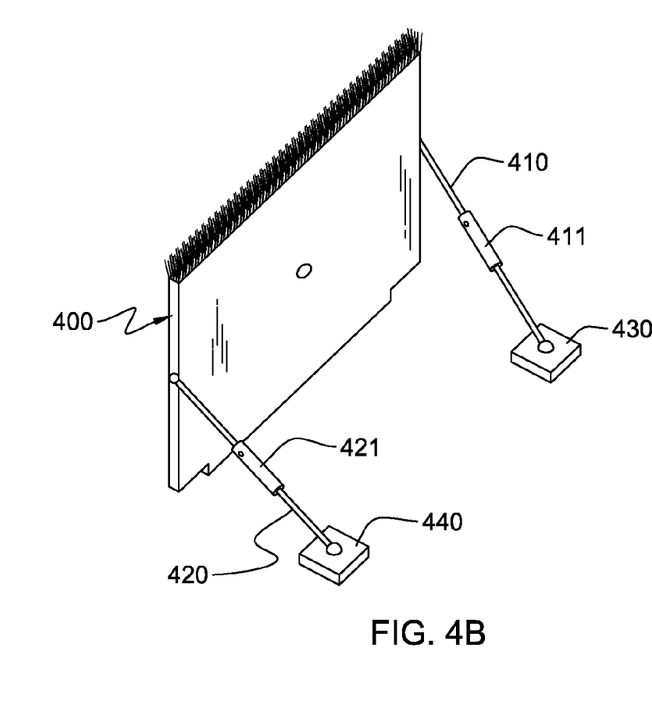
FIG. 4B depicts the airflow arresting apparatus of FIG. 4A, with the arm-locking sleeves positioned to lock the first and second pivoting arms of the airflow arresting apparatus extended, in accordance with an aspect of the present invention.

FIGS. 4A & 4B depict further details of an airflow arresting apparatus, in accordance with an aspect of the present invention. This airflow arresting apparatus includes an airflow arrester 400 which comprises a panel 401 constructed as an airflow blocker. A small opening 404 is provided in panel 401 to allow the panel to be secured in a collapsed shipping position, as described further hereinbelow with reference to FIG. 5B. Panel 401 also includes a top edge 402 having a plurality of brushes 403 (or brush-like structures) extending upwards therefrom. Brushes 403 facilitate blocking of airflow from passing over top edge 402 of panel 401 when the panel is operatively positioned above an electronics rack, and provide a tolerance which allows the same airflow arrester 400 to be employed with electronics racks of different height, that is, within the tolerance offered by the plurality of brushes, or to be employed with identically-sized electronics racks in the same or different data centers with different spacings between the electronics racks and the ceiling structures above the racks, again, within the tolerance offered by the plurality of brushes 403. Brushes 403 are of sufficient quantity and density to substantially block airflow from passing through the plurality of brushes.

Airflow arrester 400 further includes a first pivoting arm 410 coupling one side of panel 401 to a first positioning slider 430 and a second pivoting arm 420 coupling a second side of panel 401 to a second positioning slider 440. In one embodiment, a locking pivot 405 is used at each side of panel 401 to respectively secure the first and second pivoting arms 410, 420 to the sides of panel 401. As one example, a shoulder screw may be employed as the locking pivot. Alternatively, a spring plunger could be employed fixed on a pivoting part, and separated from a pivoting point, with the plunger extending through a hole in the fixed part. To rotate, the plunger is retracted, the arm pivoted, and then the plunger is released to engage another hole in the fixed part.

As shown in FIGS. 4A & 4B, airflow arrester 400 further includes a first locking mechanism 411 and a second locking mechanism 421. First locking mechanism 411 selectively locks first pivoting arm 410 in the extended position illustrated in FIGS. 4A & 4B, while second locking mechanism 421 selectively locks second pivoting arm 420 in the extended position. In one embodiment, the first locking mechanism is a first arm-locking sleeve slidable over a collapsible pivot point 412 of first pivoting arm 410 and the second locking mechanism is a second arm-locking sleeve slidable over a collapsible pivot point 422 of second pivoting arm 420, as illustrated in FIG. 4B. A spring-biased locking pin is employed to retain the first and second arm-locking sleeves in a fixed position about the respective collapsible pivot points, and thus maintain the first and second pivoting arms 410, 420 in extended position.

As shown in FIG. 4B, first pivoting arm 410 engages first positioning slider 430 at the distal end thereof, and second positioning arm 420 engages second positioning slider 440 at the distal end thereof. Recessed or cutout portions 406, 407 (FIG. 4A) of panel 401 are provided at the bottom corners of panel 401 to accommodate the first and second tracks (see FIG. 5A) when airflow arrester 400 is operatively positioned above an electronics rack, with the first and second positioning sliders 430, 440 engaging the first and second tracks.

Figure 5A:
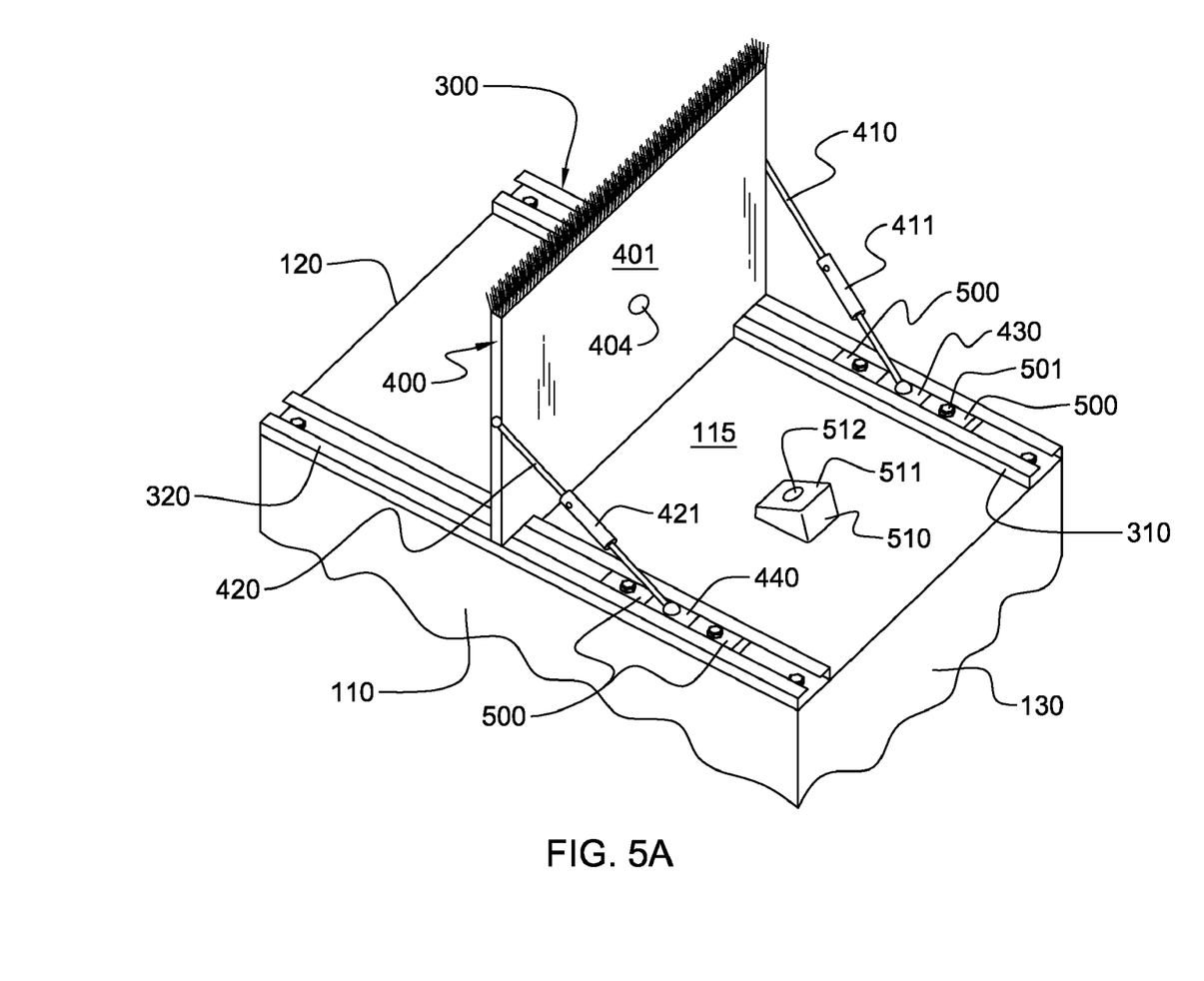
FIG. 5A is an isometric view of the airflow arresting apparatus of FIGS. 3, 4A & 4B disposed in operative position above an electronics rack, in accordance with an aspect of the present invention.
Figure 5B:
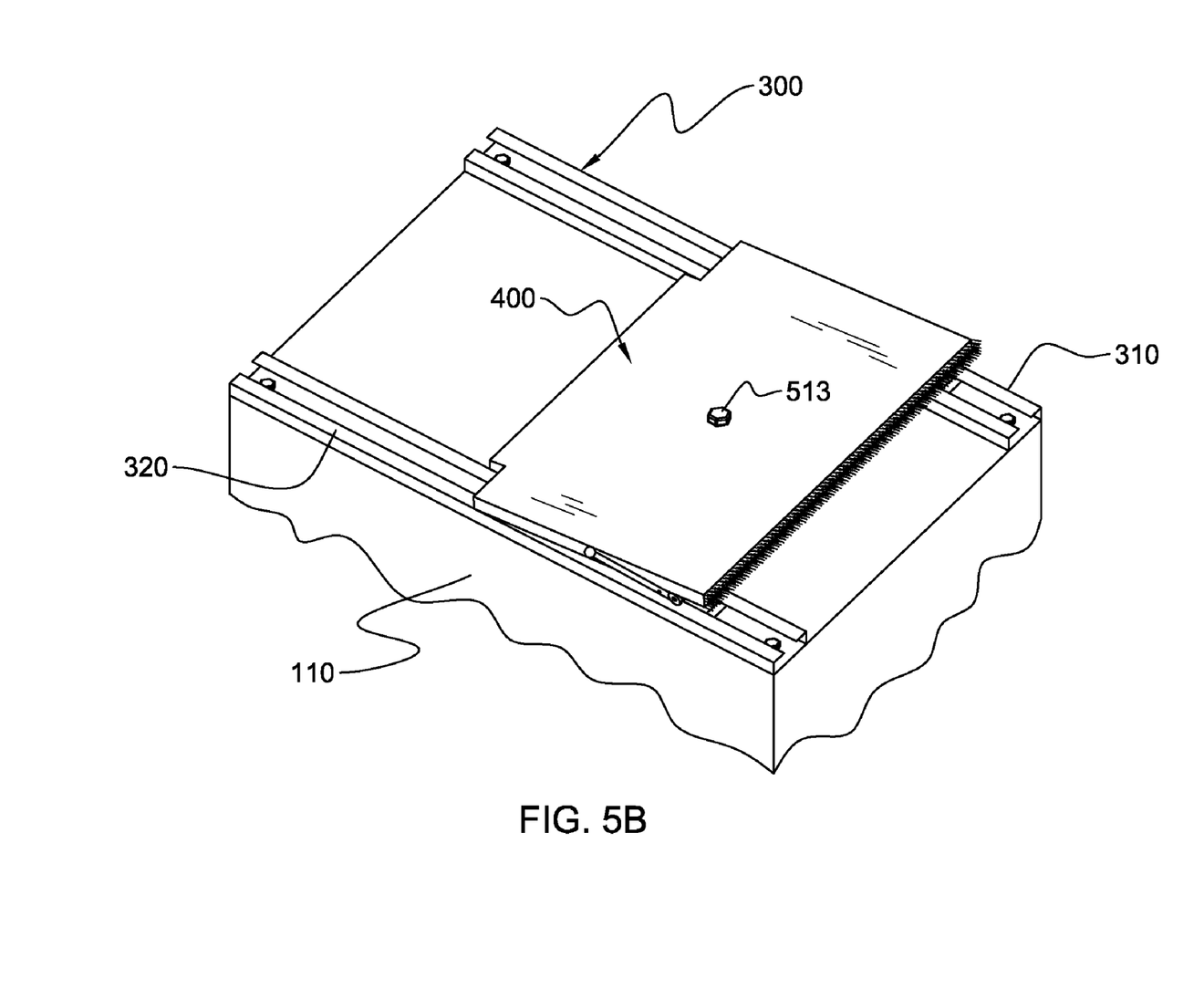
FIG. 5B depicts the electronics rack and airflow arresting apparatus of FIG. 5A, with the airflow arrester shown secured in collapsed position, in accordance with an aspect of the present invention.

FIGS. 5A & 5B depict airflow arrester 400 operatively positioned within track mechanism 300 above top surface 115 of electronics rack 110. As illustrated, panel 401 extends vertically from top surface 115 to block airflow between air outlet side 130 and air inlet side 120 of electronics rack 110 (as described further below with reference to FIG. 6). In FIG. 5A, first and second pivoting arms 410, 420 are shown in locked, extended position with first locking mechanism 411 disposed over the collapsible pivot point of first pivoting arm 410 and second locking mechanism 421 positioned over the collapsible pivot point of second pivoting arm 420. In this embodiment, first and second positioning sliders 430, 440 are each held in position by locking sliders 500 disposed on either side thereof. Each locking slider 500 includes a set screw 501, which when threaded, engages the respective first or second track 310, 320, and thereby facilitates securing the adjacent positioning slider 430, 440 in fixed position above top surface 115 of electronics rack 110.

As shown in FIG. 5A, a raised land 510 is secured, for example, by soldering, welding or brazing, to top surface 115 of electronics rack 110. Raised land 510 includes an angled upper surface 511 with a threaded opening 512, and is positioned and sized to physically engage panel 401 when the panel is collapsed for shipping of the electronics rack, as illustrated in FIG. 5B. As shown in FIG. 5B, a bolt or screw 513 is employed to threadably engage threaded opening 512 (FIG. 5A) of raised land 510 and thereby secure airflow arresting apparatus 500 in the collapsed position. When collapsed, the first and second pivoting arms of airflow apparatus 400 fold under the airflow arrester so that the profile of the airflow arrester above first track 310 and second track 320 of track mechanism 300 is minimized, thus facilitating shipment of the electronics rack with the airflow arresting apparatus attached to the rack.

Figure 6:
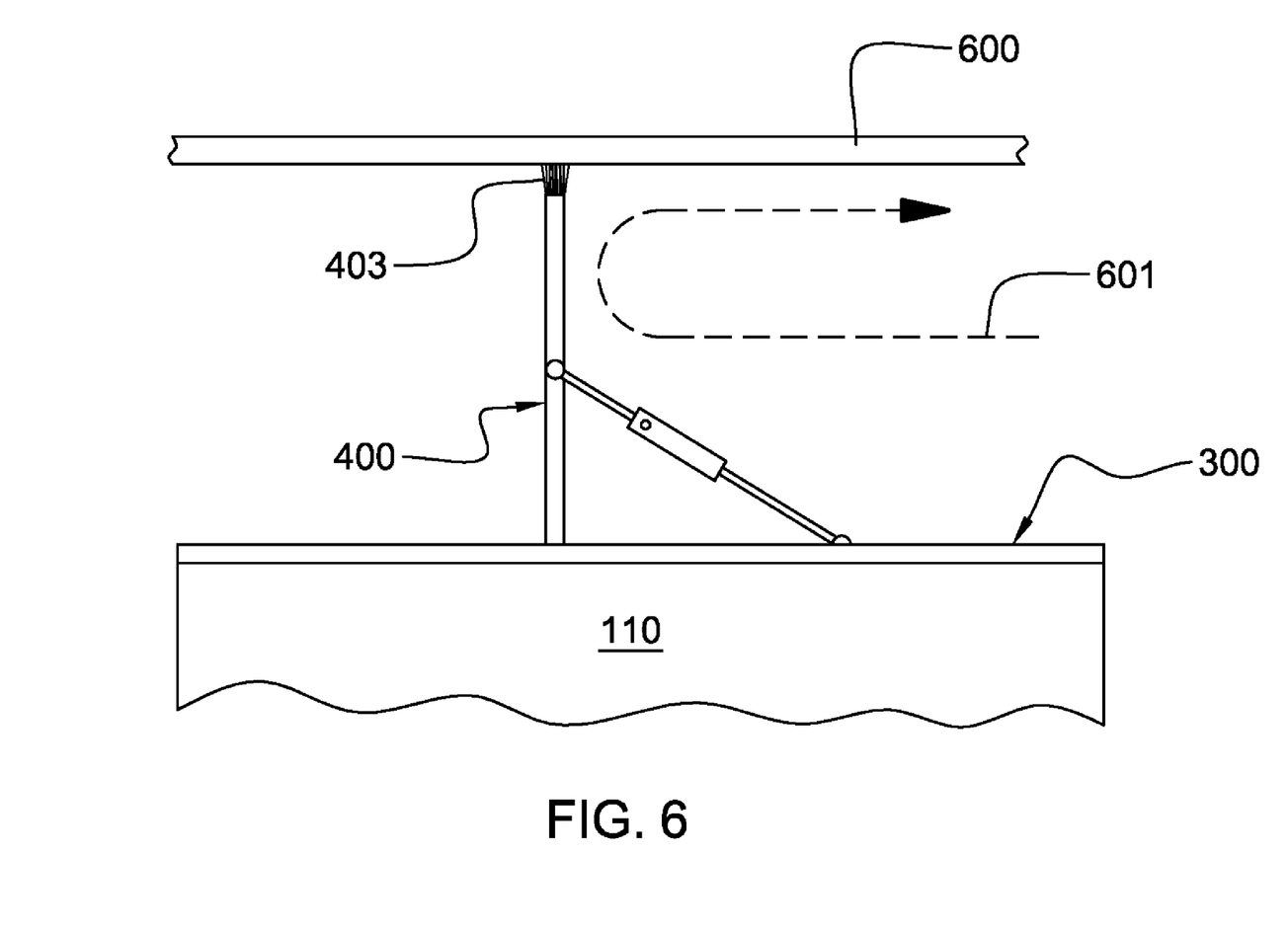
FIG. 6 is a partial side elevational view of the electronics rack and airflow arresting apparatus of FIGS. 5A & 5B, with the airflow arrester shown in operative position and brushes on the top edge thereof contacting a ceiling structure of a data center containing the electronics rack, in accordance with an aspect of the present invention.

FIG. 6 is an elevational view of the airflow arresting apparatus of FIGS. 3-5B, shown in operative position with the airflow arrester 400 vertically disposed above the top surface of an electronics rack 110 and the first and second pivoting arms locked, and in fixed position within track mechanism 300. As shown, brushes 403 provide a tolerance for use of airflow arrester 400 with different electronics rack/data center height combinations, where an overhead structure 600, such as a ceiling structure of the data center, is disposed above electronics rack 110.

Figure 7A:
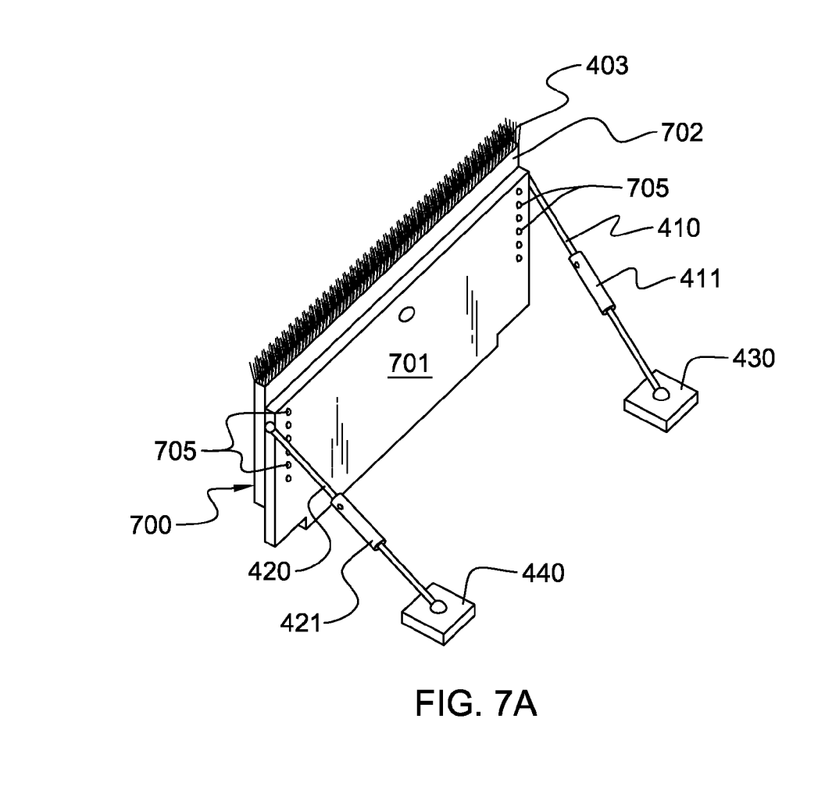
FIG. 7A is an isometric view of an alternate embodiment of an airflow arresting apparatus comprising two telescoping panel sections, in accordance with an aspect of the present invention.
Figure 7B:
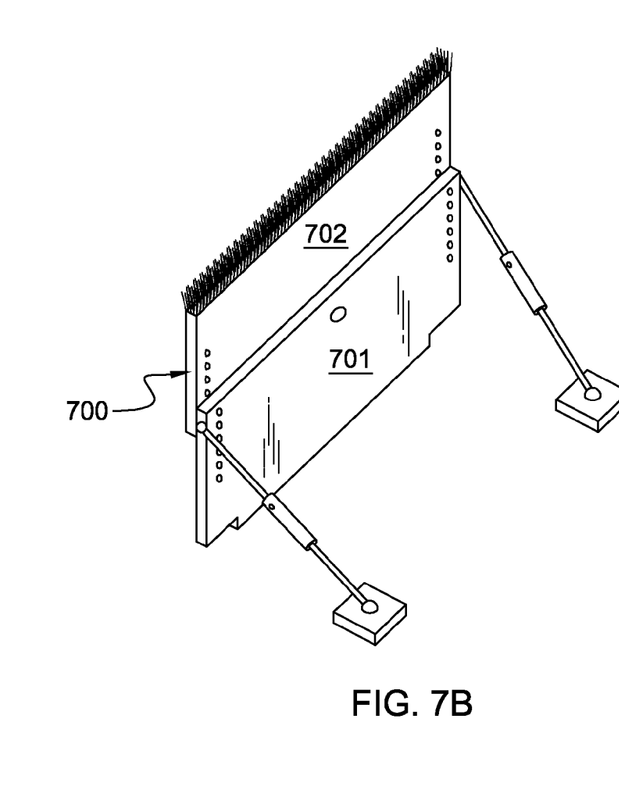
FIG. 7B depicts the airflow arresting apparatus of FIG. 7A, with the telescoping panel sections thereof in extended position, in accordance with an aspect of the present invention.

FIGS. 7A & 7B depict an alternate embodiment of an airflow arresting apparatus, in accordance with an aspect of the present invention. In this embodiment, the airflow arresting apparatus comprises a telescoping airflow arrester 700 comprising a first panel section 701 and a second panel section 702, which adjustably telescopes from first panel section 701 employing a plurality of push-pin openings 705 along the sides thereof and, for example, spring-biased pins. In this embodiment, the top edge of second panel section 702 includes a plurality of brushes 403, such as described above in connection with the embodiment of FIGS. 4A-6. Similarly, telescoping airflow arrester 700 includes a first pivoting arm 410 and a second pivoting arm 420, which are illustrated in the figures in locked position with a first locking mechanism 411 and a second locking mechanism 421, positioned over respective collapsible pivot points of the first and second pivoting arms, as described above. First and second pivoting arms 410, 420 engage at their distal ends a respective positioning slider 430, 440, as described above. FIG. 7B illustrates the telescoping airflow arrester 700 of FIG. 7A, with second panel section 702 in extended, operative position from first panel section 701. Telescoping airflow arrester 700 provides further tolerance for use of the airflow arresting apparatus with different electronics rack/data center combinations, wherein spacing between the top surface of an electronics rack and an overhead ceiling structure of the data center varies. By being adjustable to the spacing between a particular electronics rack and data center ceiling structure, the airflow arresting apparatus described herein allows substantially all airflow to be blocked between the air inlet side and air outlet side of the electronics rack over the top of the electronics rack. Further, by positioning a plurality of electronics racks in a row within a data center, each having an airflow arresting apparatus as described herein, airflow over the top of the row of electronics racks can be substantially blocked between the air inlet sides and air outlet sides of the racks.

Figure 8:
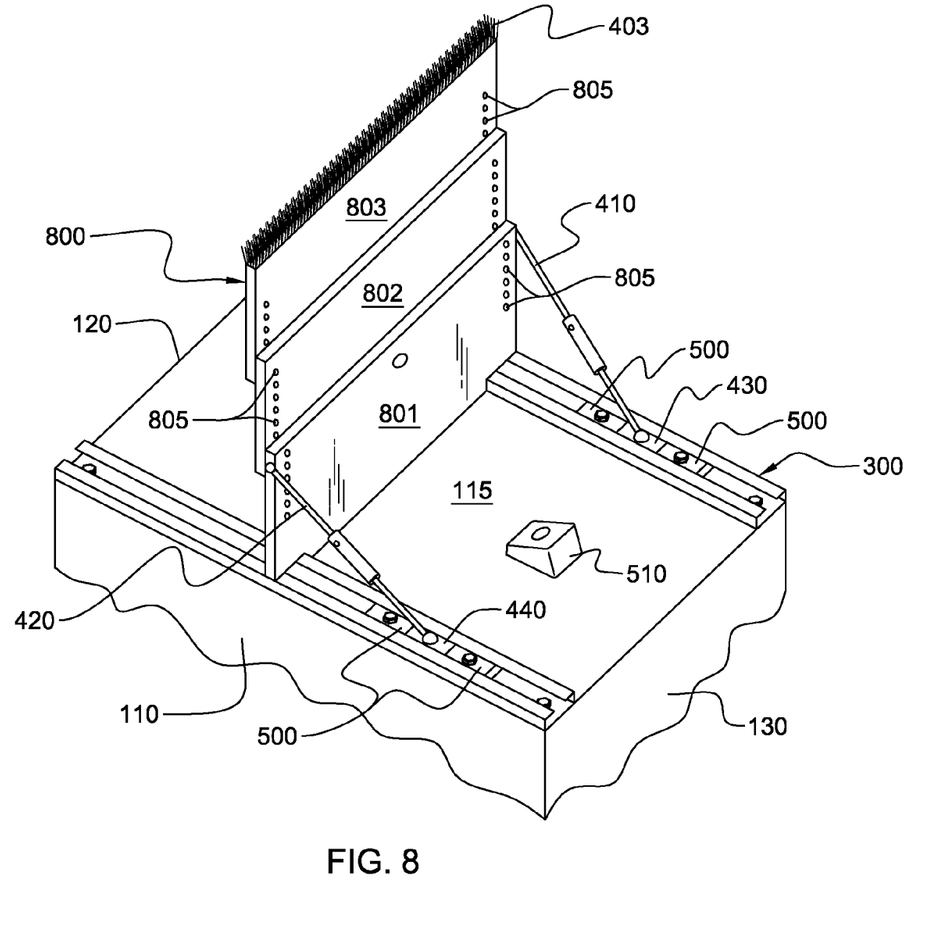
FIG. 8 is an isometric view of an electronics rack and an airflow arresting apparatus comprising three telescoping panel sections, in accordance with an aspect of the present invention.
Figure 9:
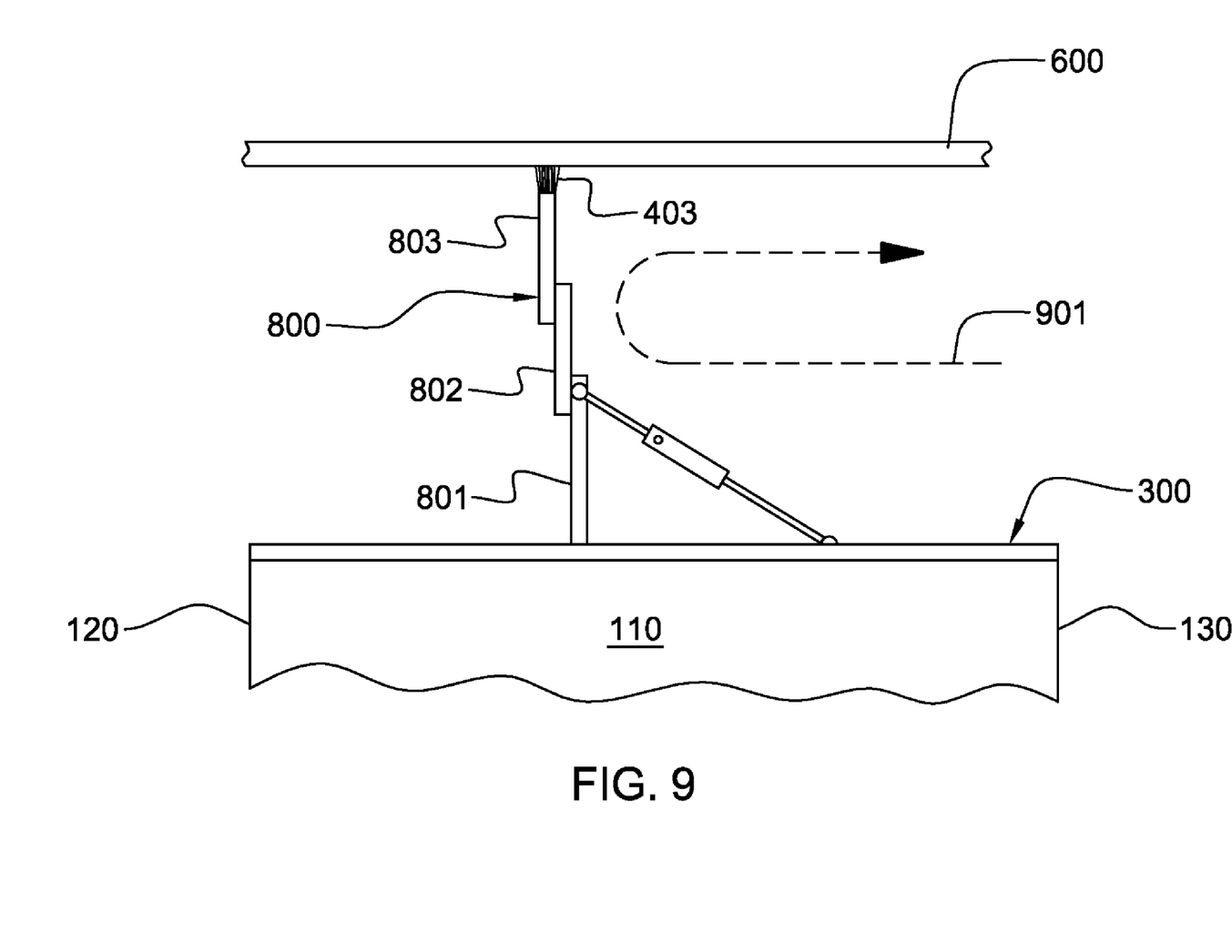
FIG. 9 is an elevational view of the electronics rack and airflow arresting apparatus of FIG. 8, with the airflow arrester shown in operative position and the telescoping panel sections extended vertically above the electronics rack so that brushes along the top edge of the airflow arrester contact a ceiling structure of a data center containing the electronics rack, in accordance with an aspect of the present invention.

FIGS. 8 & 9 depict an alternate embodiment of an airflow arresting apparatus employing a telescoping airflow arrester. In this embodiment, the telescoping airflow arrester 800 includes three panel sections, namely, a first panel section 801, a second panel section 802 and a third panel section 803, which telescope relative to each other using a plurality of push-pin openings 805 in each panel section along the sides thereof, and respective spring-biased pins (not shown). Advantageously, providing three or more telescoping panel sections allows the airflow arrester described herein to be readily configured to accommodate electronics racks and/or data centers of different heights.

As shown in FIG. 8, telescoping airflow arrester 800 includes a plurality of brushes 403 along a top edge of third panel section 803, and first and second pivoting arms 410, 420, which couple telescoping airflow arrester 800 to positioning sliders 430, 440, respectively. Multiple locking sliders 500 are employed to secure positioning sliders 430, 440 in fixed position within the respective tracks of track mechanism 300. Top surface 115 of electronics rack 110 includes a raised land 510, configured as described above in connection with FIG. 5A for facilitating securing of telescoping airflow arrester 800 in a collapsed position, for example, for shipment of the electronics rack with the airflow arresting apparatus described herein attached. One or more panel section 801, 802, 803 includes an appropriately sized opening to receive a screw or bolt (not shown) for securing the telescoping airflow arrester in collapsed position against raised land 510.

The airflow arresting apparatus of FIG. 8 is operatively illustrated in FIG. 9 in elevational view. As shown, the telescoping airflow arrester 800, with first panel section 801, second panel section 802 and third panel section 803 extended, blocks airflow 901 over the top of electronics rack 110 between air outlet side 130 and air inlet side 120. In this embodiment, the telescoping airflow arrester is again in fixed position within track mechanism 300 (e.g., employing one or more locking structures), and brushes 403 at the top edge of third panel section 803 contact ceiling structure 600 above electronics rack 110.

Figure 10:
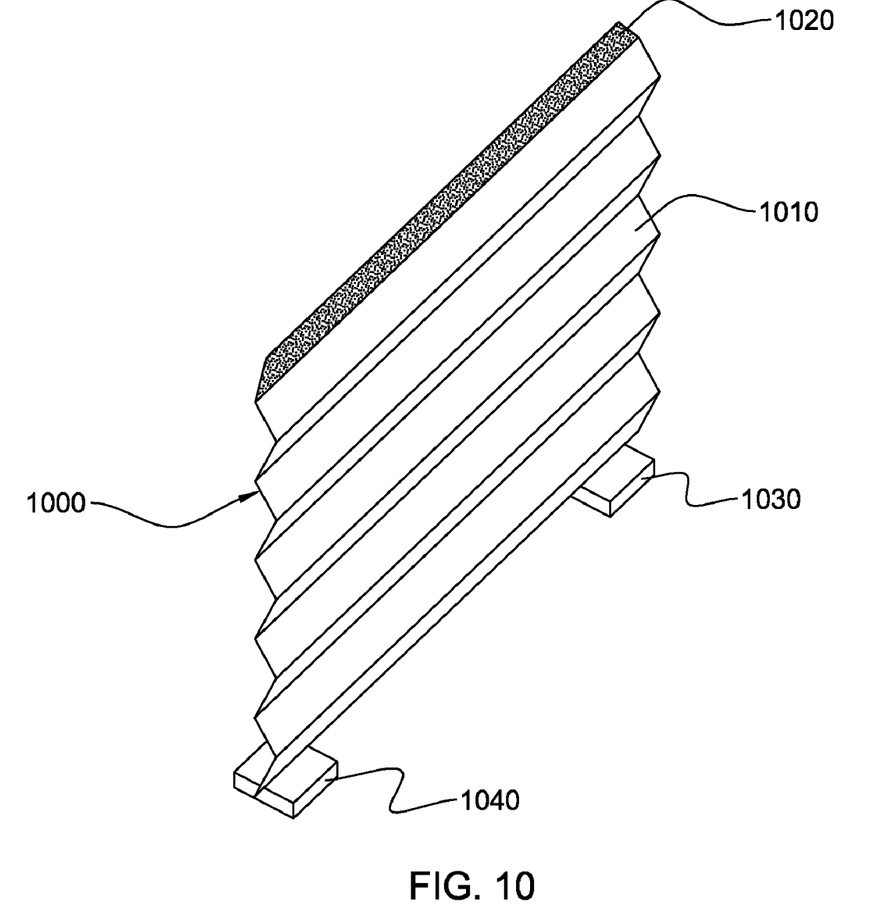
FIG. 10 is a partial isometric view of another alternate embodiment of an airflow arresting apparatus, in accordance with an aspect of the present invention.

FIG. 10 depicts an alternate embodiment of an airflow arrester 1000 of an airflow arresting apparatus, in accordance with an aspect of the present invention. In this embodiment, the airflow arrester comprises a fanfold panel 1010 which includes an attachment mechanism 1020 along an upper edge thereof. Attachment mechanism 1020 might comprise, for example, one portion of a hook and loop type fastener, wherein either hooks or loops are secured to the top edge of fanfold panel 1010, and the other of the hooks and loops are secured, for example, to a ceiling structure of a data center containing an electronics rack with the airflow arresting apparatus positioned on top thereof. As is well known, such hooks and loops are separable along their interface, with the hook side of the hook and loop type fastener comprising a piece of fabric covered with small plastic hooks, and the loop side covered with an even smaller, higher density number of plastic loops. Fanfold panel 1010 is shown secured at the lower corners thereof to a first positioning slider 1030 and a second positioning slider 1040, which comprise part of a track mechanism such as described above in connection with the embodiments of FIGS. 3-9. If desired, fanfold panel 1010 could be configured at a lower edge thereof to drop between a first and second track of the track mechanism in a manner analogous to the airflow arresters of FIGS. 4A-9. Advantageously, fanfold panel 1010 provides significant adjustability for variations in height between the top surface of an electronics rack and a ceiling structure of a data center containing the electronics rack.

Although preferred embodiments have been depicted and described in detail herein, it will be apparent to those skilled in the relevant art that various modifications, additions, substitutions and the like can be made without departing from the spirit of the invention and these are therefore considered to be within the scope of the invention as defined in the following claims.

What is claimed is:

1. An airflow arresting apparatus comprising:
an airflow arrester, the airflow arrester comprising a panel sized and configured to reside above an electronics rack, and when operatively positioned above the electronics rack, to extend vertically above the electronics rack and at least partially block airflow from passing over the electronics rack between an air outlet side and an air inlet side thereof; and
a track mechanism sized and configured to reside above the electronics rack, the airflow arrester slidably engaging the track mechanism, wherein the track mechanism facilitates positioning of the airflow arrester at a desired location above the electronics rack between the air inlet side and the air outlet side thereof.

2. The apparatus of claim 1, wherein the track mechanism comprises a first track and a second track configured for securement to the electronics rack between the air inlet side and the air outlet side thereof along respective sides of the electronics rack, and wherein the track mechanism further comprises a first positioning slider slidably engaging the first track and a second positioning slider slidably engaging the second track, wherein the airflow arrester is coupled to the first positioning slider and to the second positioning slider for facilitating positioning of the airflow arrester at the desired location above the electronics rack.

3. The apparatus of claim 2, wherein the airflow arrester further comprises a first pivoting arm coupling one side of the panel to the first positioning slider and a second pivoting arm coupling a second side of the panel to the second positioning slider, wherein the first pivoting arm and the second pivoting arm allow for collapsing of the airflow arrester to facilitate shipping thereof, and wherein the airflow arrester further comprises a first locking mechanism and a second locking mechanism, the first locking mechanism facilitating selective locking of the first pivoting arm in an extended position and the second locking mechanism facilitating selective locking of the second pivoting arm in an extended position to secure the panel vertically in an operative position above the electronics rack.

4. The apparatus of claim 3, wherein the first locking mechanism comprises a first arm-locking sleeve slidable over a collapsible pivot point of the first pivoting arm and the second locking mechanism comprises a second arm-locking sleeve slidable over a collapsible pivot point of the second pivoting arm, wherein the first and second arm-locking sleeves selectively lock the first and second pivoting arms extended when positioned over the collapsible pivot points thereof.

5. The apparatus of claim 2, further comprising at least one first locking structure engaging the first track for selectively locking the first positioning slider in a fixed position relative to the first track, and at least one second locking structure engaging the second track for selectively locking the second positioning slider in fixed position relative to the second track.

6. The apparatus of claim 1, wherein the panel is a telescoping panel comprising at least a first panel section and a second panel section, wherein the second panel section telescopes from the first panel section to facilitate vertical extension of the panel when operatively positioned above the electronics rack.

7. The apparatus of claim 1, wherein the airflow arrester further comprises brushes extending along a top edge of the panel for facilitating blocking of airflow from passing over the top edge of the panel when the panel is operatively positioned above the electronics rack.

8. The apparatus of claim 1, wherein the panel comprises a fanfold panel, and wherein the airflow arrester further comprises an attachment mechanism along a top edge of the panel to facilitate securing of the panel to a structure disposed above the electronics rack and thereby vertically extend the fanfold panel above the electronics rack in an operative position and hold of the fanfold panel in the operative position.

9. A data center comprising:
at least one electronics rack, each electronics rack comprising:
an air inlet side and an air outlet side, the air inlet and air outlet sides respectively enabling ingress and egress of external air;
at least one electronics subsystem requiring cooling;
at least one air-moving device, the at least one air-moving device being capable of causing external air to flow from the air inlet side of the electronics rack, across the at least one electronics subsystem, to the air outlet side of the electronics rack; and
at least one airflow arresting apparatus, each airflow arresting apparatus comprising:
an airflow arrester, the airflow arrester comprising a panel sized and configured to reside above a respective electronics rack of the at least one electronics rack, and when operatively positioned above the electronics rack, to extend vertically above the electronics rack and at least partially block airflow from passing over the electronics rack between an air outlet side and an air inlet side thereof; and
a track mechanism sized and configured to reside above the electronics rack, the airflow arrester slidably engaging the track mechanism, wherein the track mechanism facilitates positioning of the airflow arrester at a desired location above the electronics rack between the air inlet side and the air outlet side thereof.

10. The data center of claim 9, wherein the track mechanism comprises a first track and a second track configured for and secured to the electronics rack between the air inlet side and the air outlet side thereof along respective sides of the electronics rack, and wherein the track mechanism further comprises a first positioning slider slidably engaging the first track and a second positioning slider slidably engaging the second track, wherein the airflow arrester is coupled to the first positioning slider and to the second positioning slider for facilitating positioning of the airflow arrester at the desired location above the electronics rack.

11. The data center of claim 10, wherein the airflow arrester further comprises a first pivoting arm coupling one side of the panel to the first positioning slider and a second pivoting arm coupling a second side of the panel to the second positioning slider, wherein the first pivoting arm and the second pivoting arm allow for collapsing of the airflow arrester to facilitate shipping thereof, and wherein the airflow arrester further comprises a first locking mechanism and a second locking mechanism, the first locking mechanism facilitating selective locking of the first pivoting arm in an extended position and the second locking mechanism facilitating selective locking of the second pivoting arm in an extended position to secure the panel vertically in an operative position above the electronics rack.

12. The data center of claim 11, wherein the first locking mechanism comprises a first arm-locking sleeve slidable over a collapsible pivot point of the first pivoting arm and the second locking mechanism comprises a second arm-locking sleeve slidable over a collapsible pivot point of the second pivoting arm, wherein the first and second arm-locking sleeves selectively lock the first and second pivoting arms extended when positioned over the collapsible pivot points thereof.

13. The data center of claim 10, further comprising at least one first locking structure engaging the first track for selectively locking the first positioning slider in a fixed position relative to the first track, and at least one second locking structure engaging the second track for selectively locking the second positioning slider in fixed position relative to the second track.

14. The data center of claim 9, wherein the panel is a telescoping panel comprising at least a first panel section and a second panel section, wherein the second panel section telescopes from the first panel section to facilitate vertical extension of the panel when operatively positioned above the electronics rack.

15. The data center of claim 9, wherein the airflow arrester further comprises brushes extending along a top edge of the panel for facilitating blocking of airflow from passing over the top edge of the panel when the panel is operatively positioned above the electronics rack.

16. The data center of claim 9, wherein the panel comprises a fanfold panel, and wherein the airflow arrester further comprises an attachment mechanism along a top edge of the panel to facilitate securing of the panel to a ceiling of the data center disposed above the electronics rack and thereby vertically extend the fanfold panel above the electronics rack in an operative position and hold of the fanfold panel in the operative position.

17. A method of facilitating cooling of an electronics rack, the method comprising:
providing an electronics rack comprising an air inlet side and an air outlet side, the air inlet and air outlet sides respectively enabling ingress and egress of external air;
providing an airflow arresting apparatus comprising:
an airflow arrester, the airflow arrester comprising a panel sized and configured to reside above the electronics rack, wherein when operatively positioned above the electronics rack, the airflow arrester at least partially blocks airflow from passing over the electronics rack between the air outlet side and the air inlet side thereof, thereby facilitating cooling of the electronics rack; and
a track mechanism sized and configured to reside above the electronics rack, the airflow arrester slidably engaging the track mechanism;
mounting the track mechanism above the electronics rack with the airflow arrester slidably engaged therewith; and
securing the airflow arrester in a collapsed position above the electronics rack to facilitate shipment of the electronics rack with the airflow arresting apparatus secured thereto.

18. The method of claim 17, wherein the track mechanism comprises a first track and a second track sized to extend between the air inlet side and the air outlet side of the electronics rack, and a first positioning slider slidably engaging the first track and a second positioning slider slidably engaging the second track, wherein the airflow arrester is coupled to the first positioning slider and to the second positioning slider for facilitating positioning of the airflow arrester at a desired location above the electronics rack, and wherein the mounting comprises mounting the first track to a top surface of the electronics rack along a first side, and mounting the second track to the top surface of the electronics rack along a second side thereof.

19. The method of claim 18, wherein the airflow arrester further comprises a first pivoting arm coupling one side of the panel to the first positioning slider and a second pivoting arm coupling a second side of the panel to the second positioning slider, and wherein the method further comprises collapsing the first pivoting arm and the second pivoting arm to position the airflow arrester in the collapsed position to facilitate shipment of the electronics rack with the airflow arresting apparatus secured thereto.

20. The method of claim 17, further comprising operatively positioning the electronics rack within a data center, the operatively positioning including positioning the airflow arrester of the airflow arresting apparatus in an operative position to extend vertically above a top surface of the electronics rack and at least partially block airflow from passing over the electronics rack between the air outlet side and the air inlet side thereof, and wherein the positioning further comprises slidably positioning the airflow arrester at a desired position over the electronics rack between the air inlet side and air outlet side thereof.

* * * * *